US012189062B2

(12) United States Patent
Fancsali et al.

(10) Patent No.: US 12,189,062 B2
(45) Date of Patent: Jan. 7, 2025

(54) LIGHTING DEVICE FOR FREQUENCY-MODULATED EMISSION

(71) Applicant: Lumileds LLC, San Jose, CA (US)

(72) Inventors: Erno Fancsali, Heusden-Zolder (BE); Victor Zwanenberg, Eindhoven (NL)

(73) Assignee: LUMILEDS, LLC, San Jose, CA (US)

( * ) Notice: Subject to any disclaimer, the term of this patent is extended or adjusted under 35 U.S.C. 154(b) by 658 days.

(21) Appl. No.: 16/741,129

(22) Filed: Jan. 13, 2020

(65) Prior Publication Data

US 2020/0225322 A1 Jul. 16, 2020

(30) Foreign Application Priority Data

Jan. 14, 2019 (EP) ..................................... 19151561

(51) Int. Cl.
*G01S 7/484* (2006.01)
*G01S 7/4911* (2020.01)
*G01S 17/10* (2020.01)
*H03K 17/0416* (2006.01)
*H05B 45/305* (2020.01)
*H05B 45/37* (2020.01)

(52) U.S. Cl.
CPC .............. *G01S 7/484* (2013.01); *G01S 17/10* (2013.01); *H03K 17/04163* (2013.01); *H05B 45/305* (2020.01); *H05B 45/37* (2020.01); *G01S 7/4911* (2013.01)

(58) Field of Classification Search
CPC .......... H03K 17/04163; H05B 33/0818; H05B 47/10; H05B 45/305; H05B 45/37; G01S 7/484; G01S 7/4911; G01S 17/10
See application file for complete search history.

(56) References Cited

U.S. PATENT DOCUMENTS

| | | | | |
|---|---|---|---|---|
| 5,535,968 | A  * | 7/1996 | Mokkapati | G08C 23/06 330/306 |
| 8,860,322 | B2 | 10/2014 | Wei et al. | |
| 9,368,936 | B1 * | 6/2016 | Lenius | G01S 17/10 |
| 9,442,195 | B2 | 9/2016 | Tien et al. | |
| 10,989,813 | B2 * | 4/2021 | Niimura | G01C 3/06 |
| 2002/0172514 | A1 | 11/2002 | Gabello et al. | |
| 2010/0128247 | A1 * | 5/2010 | Heizmann | G01S 17/10 356/5.01 |

(Continued)

FOREIGN PATENT DOCUMENTS

EP  3301473 A1  4/2018
JP  2013239641 A  11/2013

(Continued)

OTHER PUBLICATIONS

Communication pursuant to Article 94(3) EPC dated Jan. 24, 2023 for European Patent Application No. 20700008.4.

(Continued)

*Primary Examiner* — Jennifer D Bennett
(74) *Attorney, Agent, or Firm* — Volpe Koenig

(57) ABSTRACT

A lighting device for frequency-modulated emission of a light-emitting diode (LED). The lighting device allows for higher operating frequencies and has an improved quality of the emitted light signal. Embodiments of the lighting device include an LED; a resonant driver circuit with a tuned circuit that is configured to drive the LED at an operating frequency that is based on parameters of the LED.

18 Claims, 5 Drawing Sheets

(56) References Cited

U.S. PATENT DOCUMENTS

| | | | | |
|---|---|---|---|---|
| 2011/0188027 A1* | 8/2011 | Bamji | ...................... | G01C 3/08 |
| | | | | 356/5.01 |
| 2011/0291578 A1* | 12/2011 | Philippbar | ............. | H05B 45/18 |
| | | | | 315/224 |
| 2013/0314711 A1* | 11/2013 | Cantin | ................. | B60Q 1/0023 |
| | | | | 356/445 |
| 2014/0104592 A1* | 4/2014 | Tien | ........................ | G01S 17/08 |
| | | | | 356/5.01 |
| 2018/0088213 A1* | 3/2018 | Morita | .................... | G01S 17/10 |

FOREIGN PATENT DOCUMENTS

| | | | |
|---|---|---|---|
| JP | 2015-069829 A | 4/2015 | |
| WO | 2009/072155 A1 | 6/2009 | |
| WO | 2009/109888 A1 | 9/2009 | |
| WO | 2016/046180 A1 | 3/2016 | |

OTHER PUBLICATIONS

International Search Report mailed Mar. 4, 2020 for PCT International Application No. PCT/EP2020/050127.
International Preliminary Report on Patentability Chapter I issued Jun. 16, 2021 for PCT International Application No. PCT/EP2020/050127.
Extended European Search Report dated Jul. 1, 2019 for European Patent Application No. 19151561.8.

\* cited by examiner

LIGHTING DEVICE FOR FREQUENCY-MODULATED EMISSION

CROSS REFERENCE TO RELATED APPLICATION

This application claims the benefit of EP Patent Application No. 19151561.8, filed on Jan. 14, 2019, which is incorporated by reference as if fully set forth.

FIELD OF INVENTION

The present disclosure relates to a lighting device for frequency-modulated emission comprising a light-emitting diode (LED), in particular for time of flight applications.

BACKGROUND

In time of flight applications, for example in distance measuring and 3D imaging, a frequency-modulated emission of light by a lighting device may be used. Here, lighting devices providing frequency-modulated light with operation frequencies in the MHz range may in particular be used. Laser light sources may be used in time of flight applications, for instance in lidar.

Further, LEDs are also suitable for generating frequency-modulated light. Typically, a driving circuit for an LED comprises switching means such as a field-effect transistor to obtain operating frequencies in the MHz range. The field-effect transistor receives an input signal at its gate, the input signal being provided by an external source. The input signal has, for example, a block wave form with the desired operating frequency and periodically opens and closes the field-effect transistor. The field-effect transistor may then provide an oscillating current in the driving circuit to induce a frequency-modulated emission of light by the LED.

However, this configuration of a driving circuit for LEDs has drawbacks. The maximum operating frequency is limited by the switching speed of the field-effect transistor and the properties of the driving circuit, i.e. the inductance and capacitance of the combination of the electronic components in the driving circuit. Therefore, operating frequencies for LEDs with such driving circuits are often limited to frequencies significantly lower than 40 MHz.

In addition, due to the layout of the driving circuit, the wave form of the oscillating current may be affected by the inductance and capacitance of the electronic components in the driving circuit. This may lead to a substantial deviation of the wave form of the driving current from a sinusoidal shape. The light emitted by an LED that is driven by such a current may therefore have a frequency modulation of emitted intensity that is non-sinusoidal, leading to difficulties in detection and analysis of reflected light pulses in time of flight applications.

SUMMARY

It is an object of the present invention to provide a lighting device for frequency-modulated emission comprising an LED that allows for higher operating frequencies and that in particular has an improved quality of the emitted light signal. The invention further relates to a method for operating a lighting device and a use of a lighting device based on the aforementioned object.

According to a first aspect of the present invention, a lighting device for frequency-modulated emission is provided, the lighting device comprising: an LED; a resonant driver circuit with a tuned circuit; wherein the resonant driver circuit is configured to drive the tuned circuit with an operating frequency, and wherein the tuned circuit comprises the LED.

According to a second aspect of the present invention, a method for operating a lighting device is provided, in particular a lighting device according to the first aspect, the method comprising: operating a resonant driver circuit with a tuned circuit, wherein the tuned circuit is driven by the resonant driver circuit with an operating frequency, wherein the tuned circuit comprises the LED.

According to a third aspect of the present invention, a use of a lighting device according to the first aspect in time of flight applications is provided.

Exemplary embodiments of the first, second, and third aspect of the invention may have one or more of the properties described below.

An LED for the lighting device may comprise at least one semiconductor element such as a p-n-junction, a diode, and/or a transistor. For instance, an LED may be provided in form of an LED die and/or an LED package. The LED may be arranged on a substrate, e.g. a heat sink, an interposer and in particular a (printed) circuit board, wherein at least part of the tuned circuit and the resonant driver circuit are provided by the (printed) circuit board. The LED may for instance be integrated into an LED lead frame.

The LED is used in the lighting device for frequency-modulated emission. That is, when the lighting device is operated, the LED is subject to a (periodically) oscillating driving current, causing the LED to emit light with an amplitude that is modulated by the oscillation of the driving current. According to the invention, a resonant driver circuit with a tuned circuit is used to provide the LED with the driving current. The resonant driver circuit is configured to drive the tuned circuit with an operating frequency. The resonant driver circuit may in principle be configured as any type of electronic oscillator circuit and in particular as an LC oscillator circuit. The tuned circuit corresponds to the part in which an oscillation of current is induced in the resonant driver circuit. The tuned circuit may also be referred to as the band pass filter of the resonant driver circuit. For instance, when the resonant driver circuit is implemented as an LC oscillator circuit, the tuned circuit may refer to the LC resonant element.

In the present case, the tuned circuit comprises the LED. For example, in the layout of an LC oscillator circuit, the band pass filter/the LC resonant element is replaced by the LED. That is, the oscillating driving current for the LED is provided by the resonant driver circuit. In contrast to the aforementioned driving circuits relying on the switching of a field-effect transistor by means of an external input signal, wherein the maximum operating frequency is limited by the switching speed of the field-effect transistor and the properties of the driving circuit, with the present invention, the properties of the tuned circuit may substantially correspond to the properties of the LED itself or may be closely adapted to the properties of the LED. That is, the tuned circuit may have a particularly simple layout with very low inductance and capacitance, such that significantly higher operating frequencies can potentially be reached.

The LED may form the tuned circuit of the resonant driver circuit in that the LED has a parasitic inductance and capacitance such that the LED itself may represent an LC element. Further, the LED may allow for a reverse recovery current in that when the driving current is reversed, the LED may allow a reverse current for a limited time. At higher frequencies, in particular at frequencies in the MHz range, the LED may therefore represent an LC resonant element. Hence, the LED may be driven (directly) by means of the resonant driver circuit. Further, when the LED is used as an LC resonant element, the wave form of the driving current has been found to be substantially sinusoidal, leading to an advantageous wave form of the frequency-modulated emitted intensity.

In another exemplary embodiment according to the invention, the resonant driver circuit comprises amplification means and a feedback loop for the amplification means. Hence, the energy losses in the resonant driver circuit, which are inter alia caused by the emission of light by the LED, may be replenished by means of the amplification means. The feedback loop may ensure that the amplification means delivers energy to the resonant driver circuit at the operating frequency with the corresponding phase. The resonant driver circuit and the lighting device may therefore be operated continuously with the amplification means and the feedback loop.

The amplification means may for example comprise at least one bipolar junction transistor, operational amplifier, and/or vacuum tube. In an exemplary embodiment according to the invention, the amplification means comprise at least one field-effect transistor. Field-effect transistors and in particular metal oxide semiconductor field-effect transistors are particularly suitable to provide amplification to the resonant driver circuit in the MHz range.

As stated above, the lighting device may provide higher frequencies for the frequency modulation of emission. In an exemplary embodiment according to the invention, the operating frequency is larger than 40 MHz, in particular larger than 70 MHz. Corresponding operating frequencies may for example improve the accuracy of time of flight measurements based on the inventive lighting device. In some embodiments, operating frequency larger than 75 MHz may be utilized.

In another exemplary embodiment according to the invention, the operating frequency substantially corresponds to a resonance frequency of the LED itself. When the LC resonant element of an LC oscillator circuit is replaced by the LED, the resonance frequency of the tuned circuit may be substantially equal to the resonance frequency of the LED itself, which is determined by the parasitic inductance and parasitic capacitance of the LED. Therefore, the operating frequency of the lighting device is substantially only limited by the properties of the LED itself.

In an exemplary embodiment according to the invention, the tuned circuit consists of the LED and series connection means for the LED. That is, no other elements than the LED and series connection means are present in the tuned circuit. The series connection means are in particular direct (and possibly very short) conductive tracks to connect the terminals of the LED to the resonant driver circuit. That is, the series connection means may have an inductance and capacitance that is low compared to the parasitic inductance and parasitic capacitance of the LED, respectively. Then the resonance frequency of the tuned circuit is substantially determined by the LED itself, such that the operation frequency may be particularly high (and may be chosen substantially equal to the resonance frequency of the LED itself).

In an alternative exemplary embodiment according to the invention, the tuned circuit consists of the LED, series connection means for the LED and a tuning inductor and/or tuning capacitor. In contrast to the aforementioned embodiment with only the LED and series connection means forming the tuned circuit, a tuning inductor and/or tuning capacitor may be added to the tuning circuit to modify the resonance frequency of the tuning circuit. For example, in case the desired operating frequency is lower than the resonance frequency of the LED itself, the resonance frequency of the tuned circuit may be lowered by adding at least one tuning inductor and/or tuning capacitor.

The tuning inductor and/or tuning capacitor may have a fixed inductance and/or capacitance, respectively. In other embodiments, the tuning inductor and/or tuning capacitor may be tuneable in the sense that the inductance and/or capacitance may be varied, such that the same lighting device may be effectively operated with different operating frequencies. In an embodiment, the tuning inductor and/or tuning capacitor are connected in series and/or parallel to the LED.

As mentioned above, different electronic oscillator circuit layouts and in particular LC oscillator circuit layouts may be used for the configuration of the resonant driver circuit. In an exemplary embodiment according to the invention, the resonant driver circuit is configured as Colpitts oscillator circuit. A Colpitts oscillator comprises a capacitive voltage divider to provide a feedback loop. A part of the capacitive voltage divider may for example be formed by the parasitic capacitance of the LED. The principle of the Colpitts oscillator may enable a simple layout of the resonant driver circuit, while Colpitts oscillators are also particularly useful to provide substantially sinusoidal driving currents with operating frequencies in the (high) MHz range.

In an exemplary embodiment according to the invention, the lighting device further comprises a synchronization circuit for synchronizing a phase and/or the operation frequency of the tuned circuit to a reference oscillation signal. Hence, the synchronization circuit may in particular provide a phase-locked loop. At least one sensor may be provided to sense current, voltage and/or emitted intensity of the LED. The signal of the at least one sensor may be used to align the phase and/or the operation frequency of the tuned circuit to the reference oscillation signal. For example, the reference oscillation signal is used in time of flight applications as reference for the analysis of the reflected light pulses.

In another exemplary embodiment according to the invention, the LED is configured to emit light in the infrared (IR) range. The LED may be characterized by a peak wavelength, i.e. the wavelength with the maximum in emitted intensity. The LED may have a peak wavelength in the IR range, e.g. above 780 nm. In particular, the peak wavelength of the IR LED may be in the near IR range, e.g. from 780 nm to 3000 nm, in particular from 800 nm to 1100 nm. Frequency-modulated light in the IR range may be used for time of flight applications.

In an exemplary embodiment according to the invention, the resonant driver circuit comprises an end switch. The end switch may be configured to activate and deactivate the resonant driver circuit, such that bursts of frequency-modulated light may be provided by the lighting device. In particular, an end switch comprising at least one gate switch is utilized, for example at least one dual gate switch.

In preferred embodiments of the invention, the lighting device is configured for use in time of flight applications. For example, distance measurements may be provided on basis of the frequency-modulated light emitted by the inventive lighting device. The lighting device may for instance be integrated into automotive autonomous cars, sensors for drones (such as obstacle avoidance systems), automotive driver monitoring systems, and/or automotive gesture control systems. Further applications are mobile 3D sensors and gaming, for example virtual reality and/or augmented reality games.

The features and example embodiments of the invention described above may equally pertain to the different aspects according to the present invention. In particular, with the disclosure of features relating to the lighting device according to the first aspect, also corresponding features relating to the method according to the second aspect and the use according to the third aspect are disclosed.

It is to be understood that the presentation of embodiments of the invention in this region is merely exemplary and non-limiting.

Other features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not drawn to scale and that they are merely intended to conceptually illustrate the structures and procedures described herein.

BRIEF DESCRIPTION OF THE DRAWING(S)

Examples of the invention will now be described in detail with reference to the accompanying drawing, in which.

DETAILED DESCRIPTION OF THE PREFERRED EMBODIMENT(S)

Figure 1:
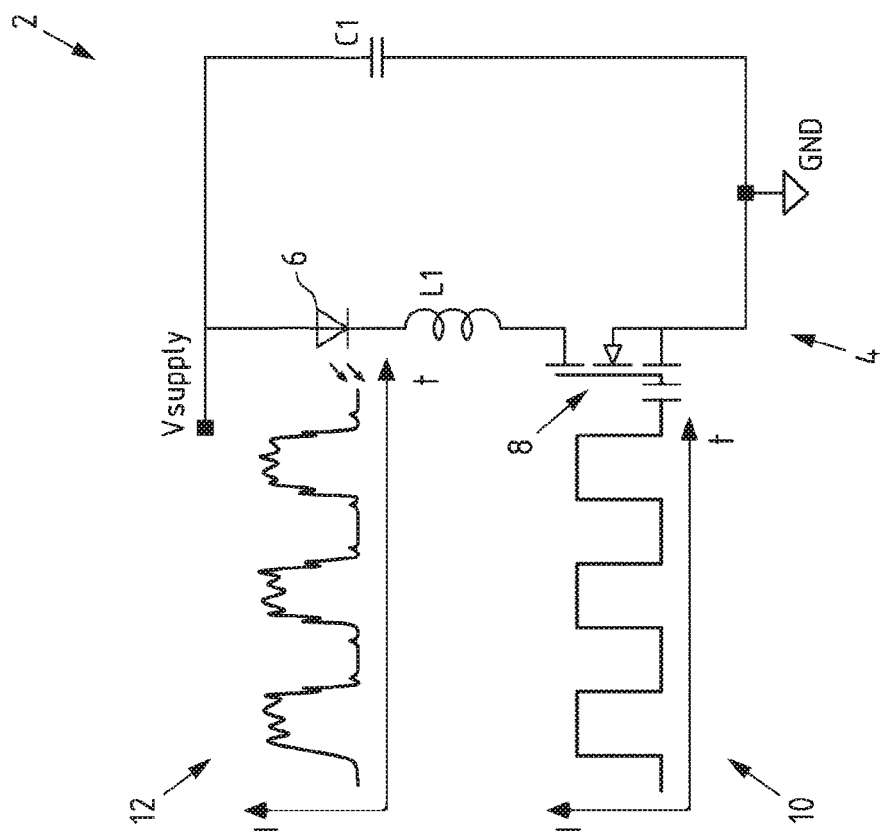
FIG. 1 shows a schematic representation of lighting device with a driving circuit according to the prior art.

FIG. 1 shows a schematic representation of lighting device 2 with a driving circuit 4 according to the prior art. The driving circuit 4 for an LED 6 comprises a field-effect transistor 8 as switching means. The field-effect transistor 8 receives an input signal 10 at the gate, periodically opening and closing the field-effect transistor 8, leading to a oscillating driving current in the driving circuit 4. The LED 6 emits light in a frequency-modulated manner with an operation frequency.

The maximum operating frequency is however limited by the switching speed of the field-effect transistor 8 and the inductance L1 and capacitance C1 of the driving circuit 4. The maximum operation frequency therefore depends on the layout of substantially the entire driving circuit 4, and is often limited to frequencies significantly lower than 40 MHz.

Further, the input signal 10 may for example have a block wave form, as illustrated in FIG. 1. The frequency of the input signal 10 corresponds to the desired operation frequency. However, in many cases, the wave form of the driving current 12 deviates strongly from a sinusoidal wave form due to the contributions of the driving circuit 4 and in particular of the inductance L1 and the capacitance C1.

Figure 2:
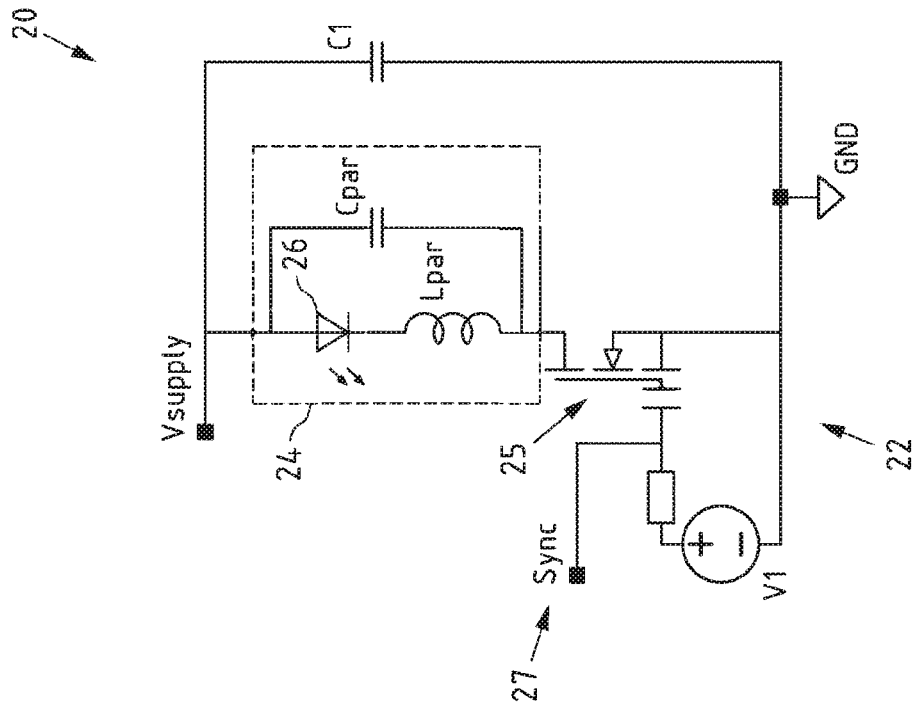
FIG. 2 shows a schematic representation of first embodiment of a lighting device according to the invention.

FIG. 2 shows a schematic representation of first embodiment of a lighting device 20 according to the invention. In contrast to the driving circuit 4 from FIG. 1 with the field-effect transistor 8 being controlled by the input signal, the lighting device 20 comprises a resonant driver circuit 22 with a tuned circuit 24. The resonant driver circuit 22 is configured to drive the tuned circuit 24 with an operating frequency. The tuned circuit 24 comprises the LED 26 in that the tuned circuit 24 consists only of the LED 26 and series connection means. In FIG. 2, the parasitic inductance Lpar and the parasitic capacitance Cpar of the LED 26 itself are schematically indicated.

The resonant driver circuit 22 shown in FIG. 2 corresponds to an LC electronic oscillator circuit, wherein the LC resonant element is replaced by the LED 26 (i.e. with the parasitic inductance Lpar and the parasitic capacitance Cpar of LED 26). Hence, the lighting device 20 may be operated with an operating frequency substantially corresponding to a resonance frequency of the LED 26 itself. The maximum operation frequency is therefore significantly higher than in lighting devices such as the one shown in FIG. 1.

The resonant driver circuit 22 comprises a field-effect transistor 25 with current source V1 as amplification means and a feedback loop 27 to replenish energy losses in the resonant driver circuit 22, in particular due to the light emission by the LED 26.

Figure 3:
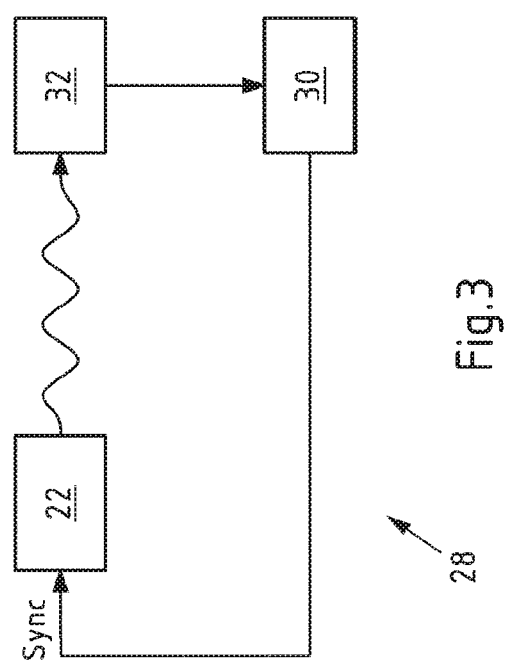
FIG. 3 shows a schematic representation of a synchronization circuit for a lighting device according to the invention.

The lighting device 20 also comprises a synchronization circuit 28 for synchronizing the phase and/or the operation frequency of the tuned circuit 24 to a reference oscillation signal that is connected to the feedback loop 27 as 'sync'. FIG. 3 shows a schematic representation of the synchronization circuit 28 comprising a phase-locked loop (PLL) 30. The PLL 30 may be based on a sensor output of sensor means 32 that detects the light emitted by the lighting device 20.

Figure 4:
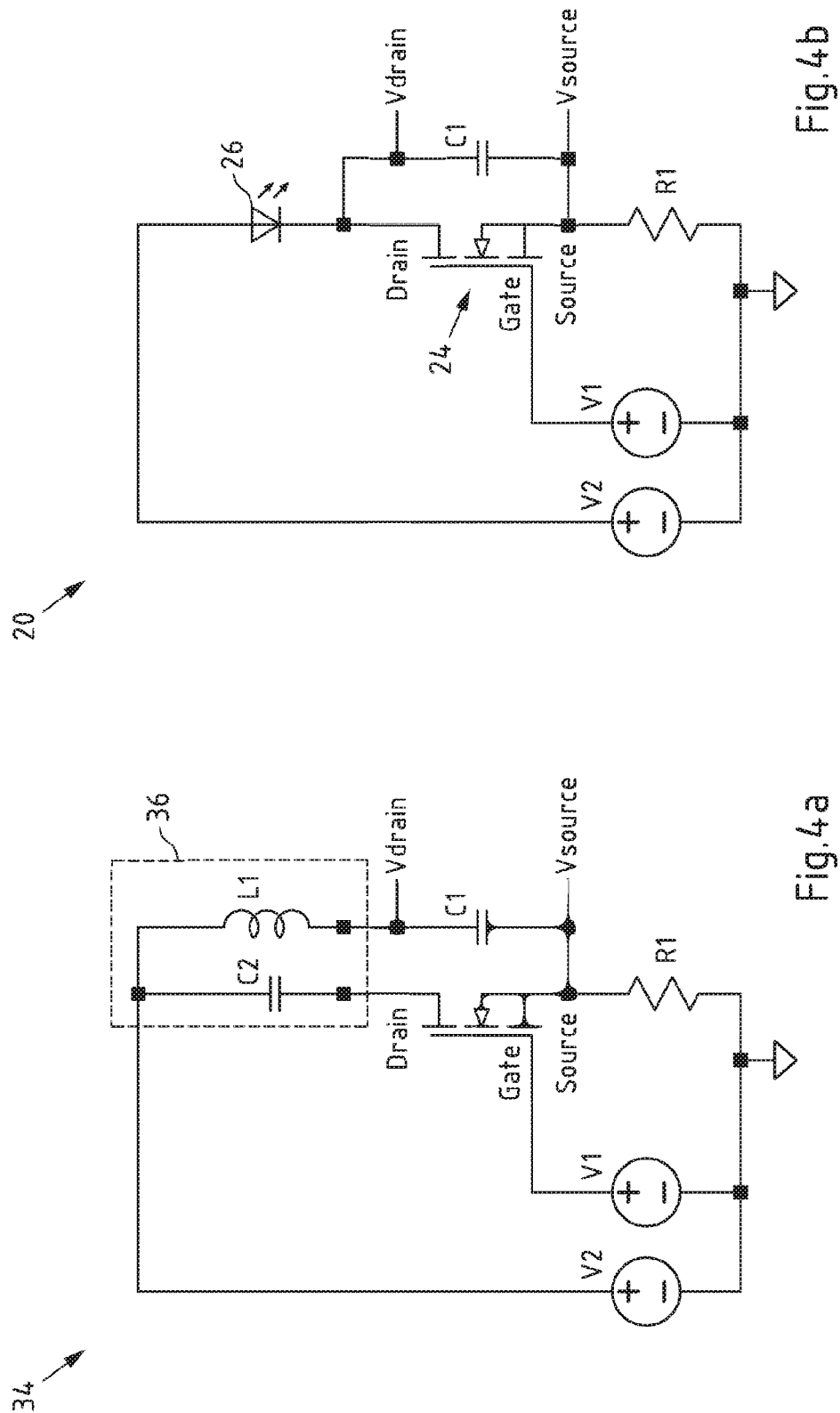
FIG. 4a shows a schematic representation of a Colpitts oscillator circuit.
FIG. 4b shows a schematic representation of second embodiment of a lighting device according to the invention.

FIG. 4a shows a schematic representation of a Colpitts oscillator circuit 34. The Colpitts oscillator circuit 34 comprises a tuned circuit 36 configured as LC resonant element with L1 and C2. The Colpitts oscillator circuit 34 may drive the tuned circuit 36 with its resonance frequency.

FIG. 4b shows a schematic representation of second embodiment of a lighting device 20 according to the invention based on the Colpitts oscillator circuit 34 of FIG. 4a. Here, the tuned circuit 36 with L1 and C2 of FIG. 4a has been replaced by the LED 26 with the corresponding parasitic inductance and the parasitic capacitance forming the tuned circuit.

Figure 5:
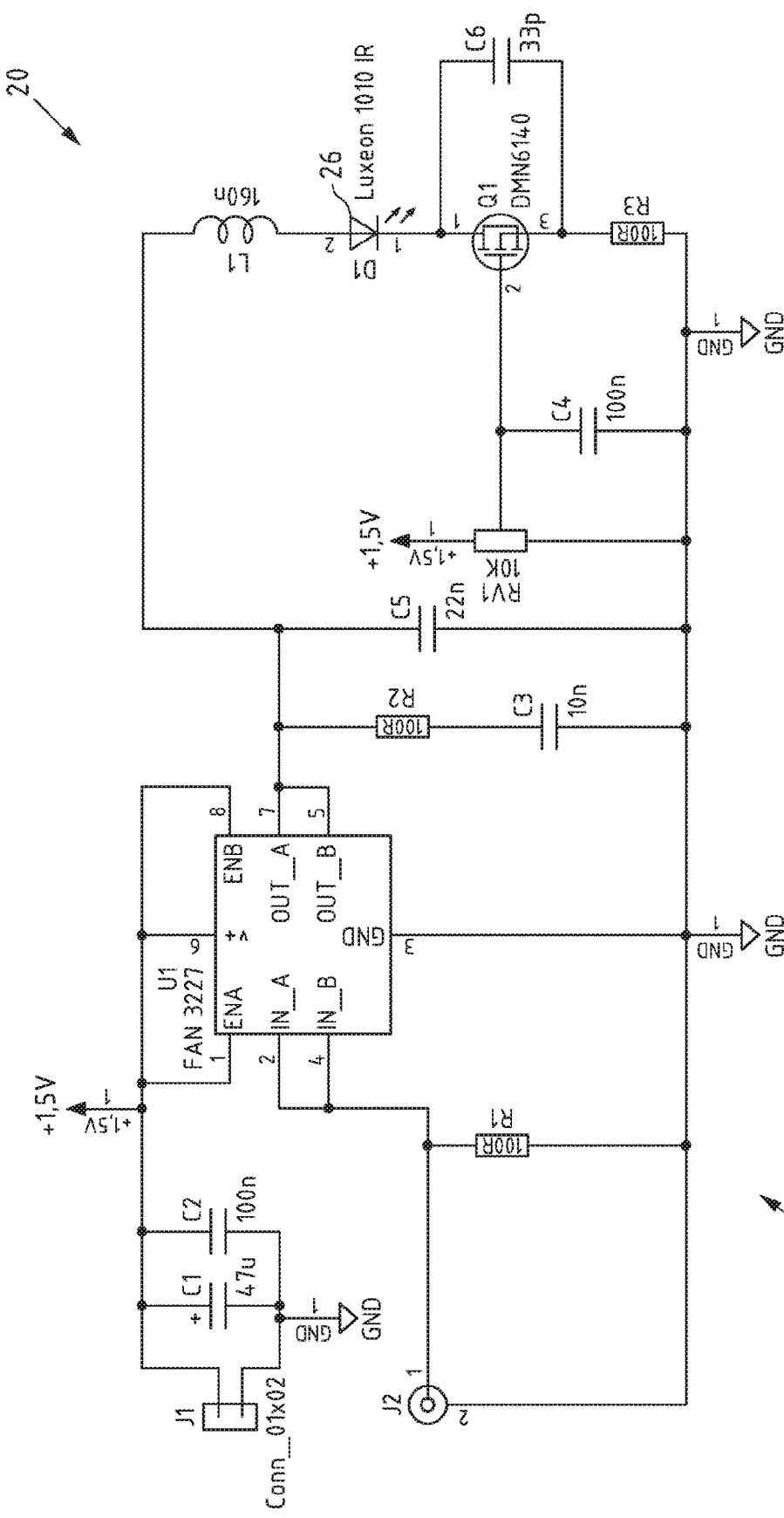
FIG. 5 shows a schematic representation of a third embodiment of a lighting device according to the invention.

FIG. 5 shows a schematic representation of a third embodiment of a lighting device 20 according to the invention. In FIG. 5, the properties of the electronic elements of the resonant driver circuit 22 are specified in further detail. The properties of the electronic elements may however be varied depending on the intended use and according to the general knowledge of the person skilled in the art, for example to incorporate other types of LEDs 26 and/or to vary the operation frequency.

In the embodiment in FIG. 5, the LED 26 is configured to emit light in the infrared range. An end switch comprising a dual gate switch FAN3227 is provided for activation and deactivation of the resonant driver circuit 22, such that bursts of frequency-modulated light may be provided by the lighting device 20.

Figure 6:
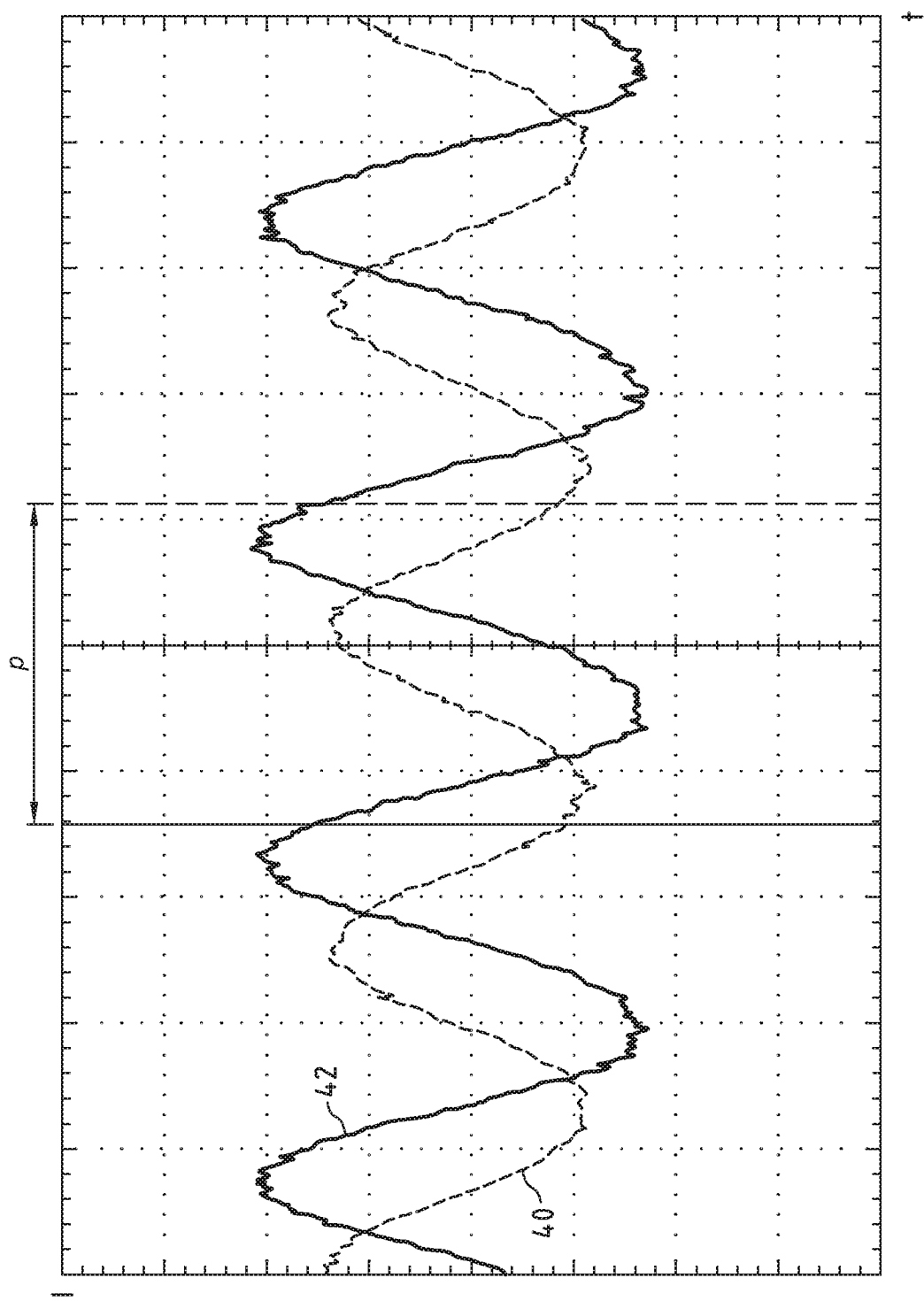
FIG. 6 shows a schematic representation of the driving current and the light output obtained with a lighting device according to the invention.

FIG. 6 shows a schematic representation of the driving current 40 and light output 42 obtained with a lighting device according to the invention in dependence of time. FIG. 6 is based on experimental results obtained with the lighting device 20 according to the scheme shown in FIG. 5. The driving current 40 and the light output 42, the latter in form of the sensor current, are shown in dependence of time in FIG. 6.

It can be seen that the wave form of both the driving current 40 and the light output 42 is substantially sinusoidal, such that a detection and analysis of the light output 42 in time of flight applications is simplified.

In the embodiment, a delay of about 5 ns is present between driving current 40 and light output 42. A period p is indicated for the light output 42, which corresponds to an operating frequency of 78 MHz. This relatively high operating frequency is made possible by the resonant driver circuit 22 with the LED 26 in the tuned circuit 24 in the lighting device according to the invention.

What is claimed is:

1. A lighting device comprising:
    a light-emitting diode (LED) operable at an operating frequency;
    a synchronization circuit configured to synchronize the operating frequency to a reference oscillation signal, wherein the operating frequency is based on a parasitic inductance and a parasitic capacitance of the LED; and
    a resonant driver circuit that includes:
        a field-effect transistor with a current source and a feedback loop configured to replenish energy losses in the resonant driver circuit based on sensor output representing light emission by the LED during operation, and
        a tunable LC circuit, the tunable LC circuit including the LED and a series connector comprising conductive components that electrically couple directly between terminals of the LED and the switch,
    wherein the tunable LC circuit is configured to allow at least one of inductance or capacitance to be varied.

2. The lighting device of claim 1, wherein the conductive components are direct conductive tracks.

3. The lighting device of claim 1, wherein the series connector has an inductance and capacitance that is lower than the parasitic inductance and the parasitic capacitance of the LED.

4. The lighting device according to claim 1, wherein the operating frequency is larger than 40 MHz.

5. The lighting device according to claim 1, wherein the operating frequency is larger than 70 MHz.

6. The lighting device according to claim 1, wherein the tunable LC circuit is a Colpitts oscillator circuit.

7. The lighting device according claim 1, wherein the synchronization circuit further synchronizes a phase of the tunable LC circuit to the reference oscillation signal.

8. The lighting device according to claim 7, wherein the synchronization circuit provides a phase-locked loop.

9. The lighting device according to claim 1, wherein the LED is configured to emit light in the infrared range.

10. The lighting device according claim 1, wherein the resonant driver circuit comprises an end switch.

11. The lighting device according to claim 10, wherein the end switch comprises at least one gate switch.

12. A time of flight system comprising:
    a time of flight sensor;
    a light-emitting diode (LED) operable at an operating frequency;
    a synchronization circuit configured to synchronize the operating frequency to a reference oscillation signal, wherein the operating frequency is based on a parasitic inductance and a parasitic capacitance of the LED; and
    a resonant driver circuit that includes:
        a field-effect transistor with a current source and a feedback loop configured to replenish energy losses in the resonant driver circuit based on sensor output representing light emission by the LED during operation, and
        a tunable LC circuit, the tunable LC circuit including the LED and a series connector comprising conductive components electrically coupled directly between terminals of the LED and a supply voltage and the switch respectively,
    wherein the tunable LC circuit is configured to allow at least one of inductance or capacitance to be varied.

13. The time of flight system according to claim 12, wherein the conductive components are direct conductive tracks.

14. The time of flight system according to claim 12, wherein the series connector has an inductance and capacitance that is lower than the parasitic inductance and the parasitic capacitance of the LED.

15. The time of flight system according to claim 12, wherein the operating frequency is larger than 40 MHZ.

16. The time of flight system according to claim 12, wherein the operating frequency is larger than 70 MHz.

17. The time of flight system according to claim 12, wherein the synchronization circuit further synchronizes a phase tunable LC circuit to the reference oscillation signal.

18. The time of flight system according to claim 17, wherein the synchronization circuit provides a phase-locked loop.

* * * * *